United States Patent [19]

Moddel et al.

[11] Patent Number: 4,612,408

[45] Date of Patent: Sep. 16, 1986

[54] ELECTRICALLY ISOLATED SEMICONDUCTOR INTEGRATED PHOTODIODE CIRCUITS AND METHOD

[75] Inventors: Garret R. Moddel; Lee A. Christel; James F. Gibbons, all of Palo Alto, Calif.

[73] Assignee: Sera Solar Corporation, Santa Clara, Calif.

[21] Appl. No.: 663,757

[22] Filed: Oct. 22, 1984

[51] Int. Cl.$^4$ .............................. H01L 27/14; H01L 31/18
[52] U.S. Cl. ..................................... 136/244; 136/249; 29/572; 29/577 C; 29/583; 357/30; 357/47; 357/49
[58] Field of Search ................ 29/572, 576 W, 577 C, 29/583, 589, 590; 156/649; 136/244, 249 MS; 357/30, 45, 47, 49

[56] References Cited

U.S. PATENT DOCUMENTS

| 4,131,984 | 1/1979 | Kaplow et al. | 29/572 |
| 4,179,318 | 12/1979 | Kaplow et al. | 148/187 |
| 4,456,782 | 6/1984 | Nishiura et al. | 136/244 |

FOREIGN PATENT DOCUMENTS 53-79479  7/1978  Japan ........................ 136/249 MS Primary Examiner—Aaron Weisstuch
Attorney, Agent, or Firm—Flehr, Hohbach, Test, Albritton & Herbert

[57] ABSTRACT

An interconnected array of solar cell or photodiode devices is formed by a method which includes the steps of forming on one major surface of a semiconductor wafer a plurality of said devices, forming grooves in said one major surface extending partway into said substrate between adjacent said devices, forming an oxide layer on selected portions of said one major surface and on the surfaces of said grooves, filling the grooves with an insulating material, forming metal interconnects between adjacent devices extending over said grooves and insulating material, attaching said one major surface to an insulating support, and severing through the wafer into the grooves from the other major surface to separate adjacent devices while leaving the metal interconnects.

14 Claims, 11 Drawing Figures

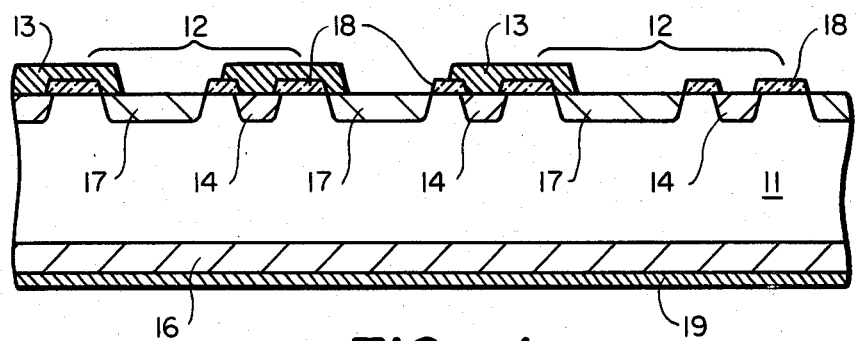
FIG_1
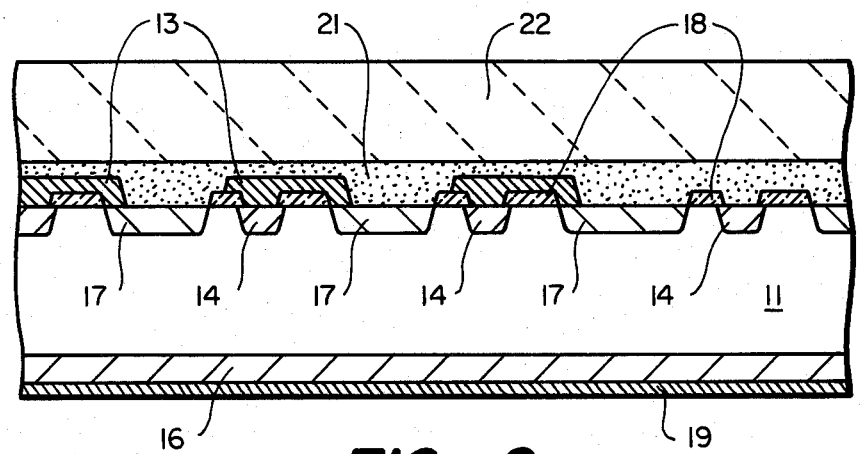
FIG_2
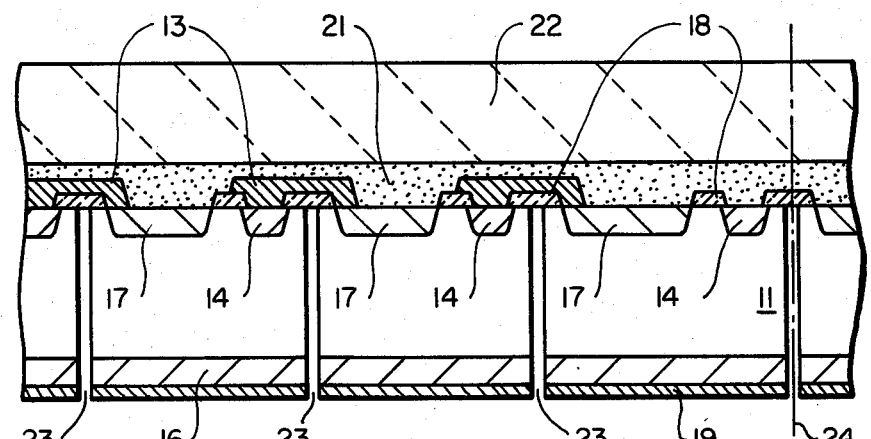
FIG_3

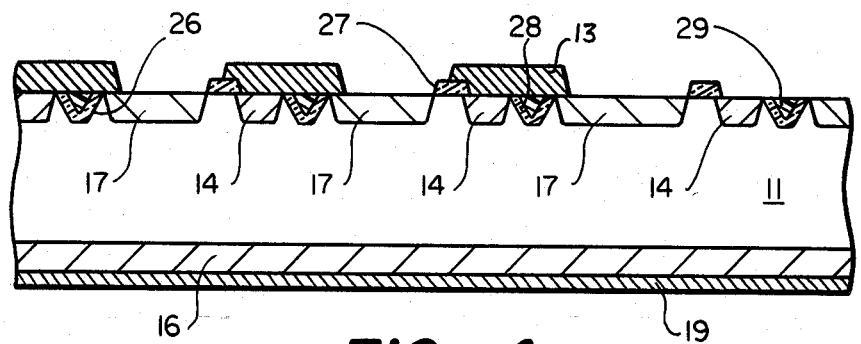
FIG_4
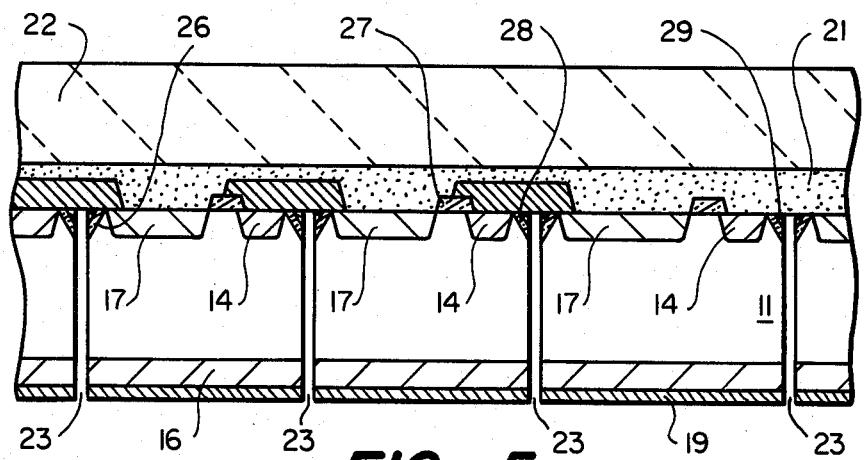
FIG_5
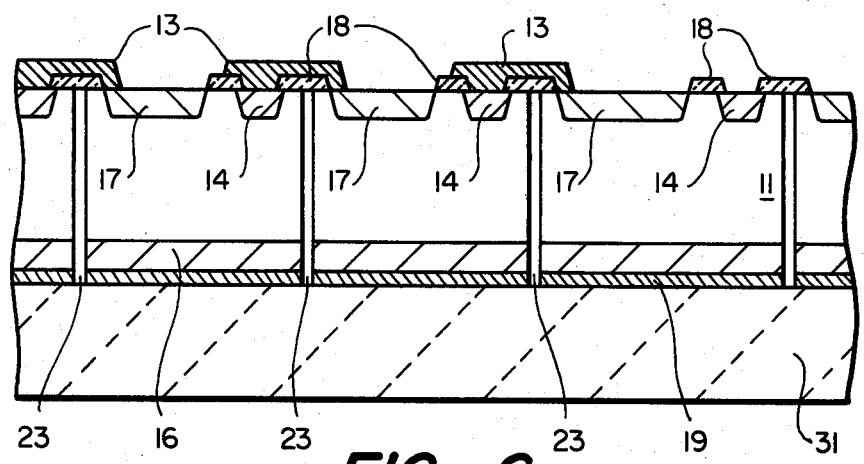
FIG_6

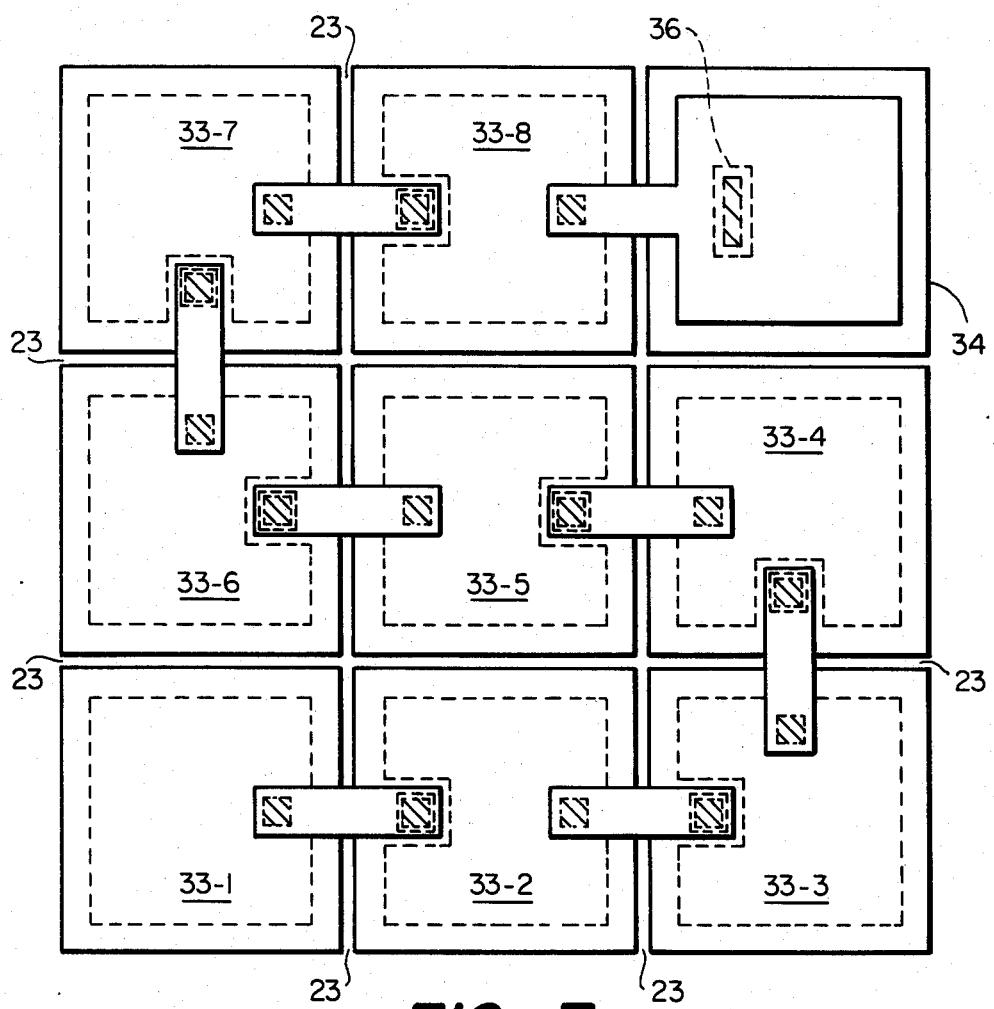
FIG_7
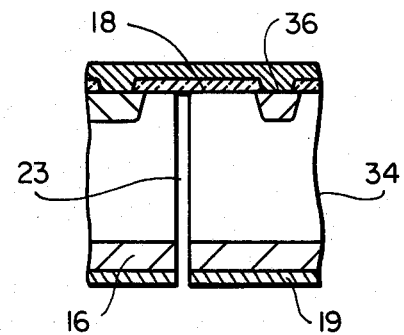
FIG_8

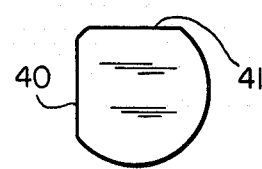
FIG_9
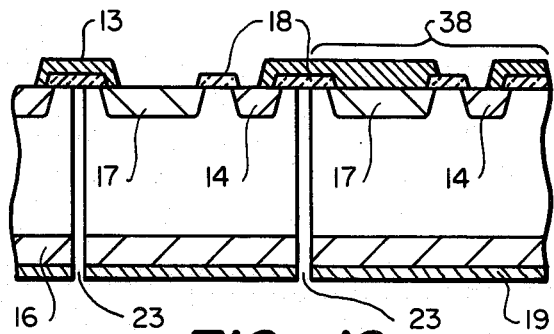
FIG_10
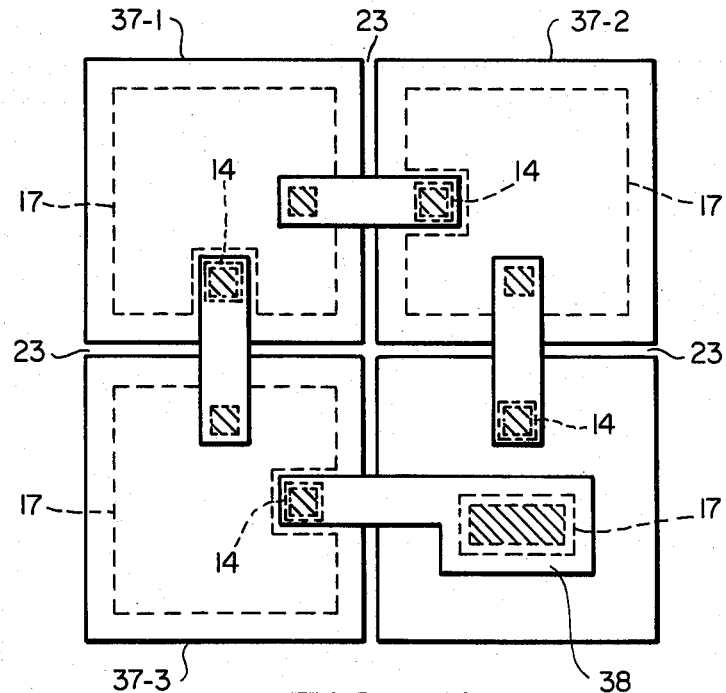
FIG_11

ELECTRICALLY ISOLATED SEMICONDUCTOR INTEGRATED PHOTODIODE CIRCUITS AND METHOD

This invention relates generally to semiconductor integrated photodiode circuits and method of making, and more particularly to such circuits in which segments or devices must be electrically isolated.

In fabricating integrated semiconductor photodiode circuits, it is often necessary to electrically isolate one segment of the circuit from another. One technique of isolating the segments is to use junction isolation. In junction isolation the segments of the circuit to be isolated are separated by layers of semiconductor material doped with a polarity opposite to that of the bulk. In cases where the correct voltage biasing conditions can be met and where high breakdown voltages and low leakage currents are not required, such junction isolation is adequate.

A second technique which is commonly employed is dielectric isolation. Special dielectric isolation wafers are fabricated for the particular circuit being built. Islands of the semiconductor (generally silicon) are defined by silicon dioxide. The isolating properties of the silicon dioxide are superior to isolating junctions. The silicon dioxide isolation technique has several drawbacks: (i) the wafers are expensive to produce, typically costing ten times more than standard wafers, (ii) the wafers are more delicate than standard wafers, and therefore may require special handling during processing to avoid breakage, and (iii) for devices requiring relatively thick (on the order of 100 microns) high quality semiconductor material, such as photodetectors (which need the thickness to absorb all the incident light), the thickness of practical silicon dioxide "tubs" is limited.

Other isolation techniques include mounting the individual segments on a separate substrate where they are interconnected to form a hybrid microcircuit, and growing islands of silicon on sapphire. These techniques are prohibitively expensive for all but the most demanding applications.

It is an object of this invention to provide a structure and method for a multi-segment semiconductor device in which individual segments are mounted on a support, electrically isolated from each other and connected where desired by conductive interconnects.

It is a further object of this invention to present a method for the fabrication of such a structure.

These and other objects are achieved by a method in which semiconductor wafers are processed to form a large number of photodiode devices, mounted to a support, and then segments or devices are isolated by a severing operation such as sawing and/or etching.

The foregoing and other objects of the invention will be more clearly understood from the following description and drawings in which:

FIG. 1 is a side elevational view of a processed semiconductor wafer including a plurality of solar cells or photodiodes.

FIG. 2 shows a support bonded to the top surface of the wafer of FIG. 1.

FIG. 3 shows the structure of FIG. 2 with the semiconductor segments severed and isolated.

FIG. 4 is a side elevational view of a processed semiconductor wafer having polyimide filled Vee-grooves between the segments to be isolated.

FIG. 5 shows a support bonded to the top surface of the wafer of FIG. 4 with grooves and polyimide isolating the semiconductor segments.

FIG. 6 is a side elevational view of another embodiment of the invention.

FIG. 7 shows a top view of an array of eight photodiodes of the type shown in FIG. 3.

FIG. 8 is a sectional side elevational view of the upper right part of the array of FIG. 7.

FIG. 9 is a top view of a semiconductor wafer for use in practicing the invention with alignment edges.

FIG. 10 is a side elevational view of an embodiment of the invention which incorporates a bypass diode.

FIG. 11 is a top view of an array of three active solar cells with a bypass diode.

Referring to FIG. 1, a semiconductor wafer 11 is processed in the standard manner to yield a number of devices 12 with metal interconnects 13 where desired. By way of example, the wafer may be p-type silicon semiconductor material. The wafer may be processed in a four mask process to form a plurality of solar cells devices 12. The first masking and diffusion steps form the upper inset p+ regions 14 and the lower region 16. The lower region serves to provide good ohmic connection and reflect minority carriers. The next masking and diffusion steps form the upper inset n+ emitter regions 17. The next step is a masking and etching step to define contact openings in the surface oxide 18. The fourth masking step defines the metal interconnect layer 13 whereby the metal extends over the oxide layer 18 and into the contact openings to provide ohmic contact to the regions 14 and 17 and connection therebetween. At the same time, a bottom metal layer 19 may be formed. The above processing is merely illustrative. The devices may be of various types formed by processes which may include oxidation, masking, etching, diffusion, implant, anneal, metalization, etc., steps. The pattern formed is appropriate for the particular devices being fabricated, and may be different from that described. At this point, the wafer is still intact, i.e., the devices or segments have not yet been separated or isolated.

In accordance with the invention, an insulating support is bonded to the top surface of the wafer. Referring to FIG. 2, an adhesive, such as epoxy 21, may be used to bond an insulating support 22, such as glass, to the semiconductor wafer 11.

The devices can then be electrically isolated from each other by sawing or masking and etching grooves 23 between them, as shown in FIG. 3. Finally, groups of devices may be separated by sawing or scribing and breaking through both the support and what remains of the processed wafer at the border between groups of devices as indicated at 24. Electrical contact may be made to the devices at the back of the wafer.

If the isolation grooves are formed by a process which involves sawing the grooves to form a rectangular (or hexagonal in special cases) grid, the shapes of devive groups is limited to a grid of crossing parallel grooves. If the grooves are formed by masking and etching, the groups may be any desired shape.

A special case of electrical isolation by the bond of an insulating support to a semiconductor wafer after processing is the use of glass as the support. Besides providing a sturdy insulating support and encapsulant for the wafer, the use of glass allows the front of the finished device to be illuminated. This is essential for devices such as photodiodes or solar cells.

An alternative embodiment to those described above involves the use of front grooves filled with polyimide.

Referring to FIG. 4, grooves 26 are preferentially etched into the upper surfaces of the wafer after the formation of the regions 14, 17. An oxide layer is then formed and etched to leave an oxide pattern 27 on the surface and oxide 28 in the grooves. Polyimide fluid is spread over the wafer, thereby filling in the grooves, and is planarized by appropriate plasma etching, thereby leaving polyimide 29 in the grooves. Metalization is carried out to form the interconnects 13 resulting in the structure depicted in FIG. 4.

The wafer is then bonded to an insulating support 22 as in the previous example. The segments are isolated by the sawing or etching through the back of the wafer, forming grooves 23 which extend up to or into the polyimide 29, as shown in FIG. 5. The advantage of using this method over the one described earlier is that the polyimide allows more leeway in the depth of cut or etch time required to form the grooves 23.

Another embodiment is a process to obtain electrically isolated segments which have the top surface exposed. The devices are fabricated as described in FIGS. 1–3 or FIGS. 4 and 5. Then a second insulating support 31 is bonded to the back of the wafer, FIG. 6, and the front support is removed. The adhesives used for bonding the supports must be such that the first is removable without affecting the second. A suitable combination is resin, which softens with temperature for bonding the support and epoxy for bonding the second support.

Two applications for these concepts and processes are described. The first is the fabrication of photodiode arrays to obtain a high output voltage. By employing the above-described process, several photodiodes may be linked in series. In accordance with this invention, a single semiconductor wafer processed to include a number of devices can be processed to include a number of devices in series as shown in FIGS. 1–5.

A second application is the fabrication of thin solar cells for space power application. Solar cells made from semiconductor material, for example silicon, which has been thinned from a thickness of 350 microns to under 100 microns, have several advantages over thicker cells: the reduced weight of thin cells decreases the cost of launching the cells into orbit, and the enhanced radiation hardness of thin cells increases their lifetime in a space environment. Generally, in the prior art such thin cells are fabricated by thinning silicon to the desired thickness, then processing it, and finally bonding it to a cover glass.

In the method claimed in this application, after the processing is carried out on a normal thick (350 micron) wafer, it is bonded to a transparent superstrate as shown in FIG. 2. The wafer is then thinned to the desired thickness by grinding, lapping and/or etching the back surface. The superstrate provides support during the thinning process. After the silicon is thinned, the back-surface damage is reduced by polishing and/or etching, and the backside of the silicon is doped, for example by implantation and pulse laser anneal. Grooves are formed, as described previously and shown in FIGS. 3 and 5, to isolate segments of the silicon wafer which are linked in series or parallel, as desired. The supporting superstrate may then be thinned by grinding, lapping and/or etching. Alternatively, the support may be a two-layer support and one layer is removed leaving a thin support layer.

There are several important advantages of this method over the standard method of thinning before processing: (i) The processing is carried out on thicker wafers. This improves the yield. Thin wafers often break during processing, resulting in 40–50% yields (F. Ho et al., *Proc. of the 16th IEEE Photovoltaics Specialists Conference*, 1982, p. 146). Furthermore, processing devices larger than 2×2 cm is not feasible on thinned wafers. (ii) The segmentation provides stress relief. In standard cells, the size of the device which can be made is limited by the thermal stress between the superstrate and the silicon which the device must sustain. The segmentation of the present method provides stress relief, permitting the fabrication of much larger devices. (iii) Segmentation allows each cell to generate high voltages when the segments are linked in series. This results in more panel redundancy (and hence reliability). The higher voltage, and hence lower current per unit power, requires smaller bus (interconnect) lines, and therefore reduces the panel weight. (iv) All contacts are on the backside. This simplifies the electrical contacting of the cells and alleviates the need for expensive wrap-around contacts.

A specific process for producing an array of eight photodiodes is now described. By standard semiconductor processing using four levels of masking, as described with reference to FIG. 1, the devices shown in FIG. 7 are fabricated on an n-type (100) silicon wafer. The device consists of eight series-connected photodiodes 33-1 through 33-8 and a blocking diode 36 formed in segment 34, FIG. 8. In battery charging applications the diode blocks the discharge of the battery through the photodiode array when the array is not illuminated. It may be replaced by a simple ohmic (n+) contact pad in cases where the blocking diode is not required. The back of the wafer consists of an n+ layer 16 covered by chromium or molybdenum metal layer 19. Electrical contact is made to the array at the back of devices 33-1 and 34 which brings the diode 36 into play.

After this stage of the processing has been completed, the wafer is sawed front side up with a dicing saw to make two alignment cuts to define alignment edges 40 and 41 as shown in FIG. 9. The cuts are used later to align the sawing or etching of the grooves 23.

The wafer is cleaned and the front bonded to a sheet of glass with clear epoxy. The thickness of the glass (protruding around the wafer) is measured and the blade height of a dicing saw is set to cut through the back of the wafer to within approximately 25 microns of the wafer/glass interface. Using the alignment cuts to reference the position, grooves are sawed across the wafer.

The wafer-glass sandwich is then etched in an aqueous solution of 30% potassium hydroxide maintained at 80 degrees Celsius until the grooves open through to the oxide; see FIG. 3. The chromium or molybdenum on the back of the wafer is etched much more slowly by the potassium hydroxide solution than is the silicon, making excellent masking material to constrain the etching of the silicon to within the grooves.

If fine grooves, having width on the order of 25 microns, are desired, the orientation of the grooves with respect to the crystalline axes of the semiconductor become important. Because the potassium hydroxide solution preferentially etches particular planes of the silicon crystal, the orientation of the grooves affects the etching rates for increasing the depth of the groove relative to increasing its width. For the (100) silicon wafer of the present example, the groove should not lie parallel or perpendicular to the (110) plane, but at some angle in between. Particular angles, such as 15 degrees from the (110) plane, allow the greatest depth to width etching ratio. The groove orientation is determined by the orientation chosen for the first masking operation (n+ layer). Therefore the masks must be designed with the appropriate pattern rotation.

The device arrays, FIG. 7, are then tested and separated by dicing or scribing.

When many solar cells or photodiodes (small arrays) are connected in series to form a larger array, it is often desirable to incorporate a bypass diode across (in parallel with) the small arrays. This diode allows current generated by the other small arrays to pass in the event of the failure of one (active) photodiode, an open circuit diode, or partial shadowing. A configuration of the invention which incorporates such a bypass diode is shown in FIGS. 10 and 11. The small array includes series connected devices 37-1, 37-2 and 37-3 of the type previously described and a bypass diode 38. Thus, four diodes are shown connected in a series ring. Three are active devices and illuminated. The bypass diode is kept dark by metal. Under normal operation the back of the lower right segment 38 in FIG. 11 forms the positive electrode and the back of the lower left segment 37-3 forms the negative electrode. In the event of a failure or shadowing, the bypass diode passes the current generated by other arrays.

Thus, there has been provided an improved integrated circuit and a process for isolating segments of the circuit has been disclosed.

We claim:

1. The method of forming an interconnected array of solar cell or photodiode devices which includes the steps of forming on one major surface of a semiconductor wafer a plurality of said devices, forming grooves in said one major surface extending partway into said substrate between adjacent said devices, forming an oxide layer on selected portions of said one major surface and on the surfaces of said grooves, filling the grooves with an insulating material, forming metal interconnects between adjacent devices extending over said grooves and insulating material, attaching said one major surface to an insulating support, and severing through the wafer into the grooves from the other major surface to separate adjacent devices while leaving the metal interconnects.

2. The method of claim 1 in which the wafer is severed by masking and etching.

3. The method of claim 2 in which the orientation of the wafer and circuits is chosen to produce selected etching characteristics.

4. The method of claim 1 in which the wafer is severed by sawing and etching.

5. The method of claim 1 in which the support is transparent material.

6. The method as in claim 5 in which the support is thinned after the wafer is severed.

7. A solar cell formed by the method of claim 5.

8. The method of claim 1 in which the semiconductor wafer is thinned after attachment to the support.

9. A solar cell formed by the method of claim 8.

10. The method of claim 1 including the additional step of forming alignment cuts from the one major surface for aligning the severing operation.

11. The method of claim 1 which includes the additional steps of attaching the other major surface to an insulating support and then removing the insulating support from the one major surface to expose the devices.

12. The method of claim 1 in which the step of forming a plurality of devices includes the step of forming a blocking diode in the wafer connected in series with the devices.

13. The method of claim 1 in which the step of forming a plurality of devices includes the step of forming a bypass diode in the wafer connected in parallel to all of the devices.

14. A solar cell formed by the method of claim 1.

* * * * *